United States Patent [19]
Tahara et al.

[11] Patent Number: 5,939,962
[45] Date of Patent: Aug. 17, 1999

[54] SPLIT TYPE MAGNETIC FIELD GENERATING APPARATUS FOR MRI

[75] Inventors: Yasuyuki Tahara; Hajime Tanabe, both of Tokyo; Hirotaka Takeshima, Ibaraki, all of Japan

[73] Assignees: Mitsubishi Denki Kabushiki Kaisha; Hitachi Medical Corporation, both of Tokyo, Japan

[21] Appl. No.: 08/906,001

[22] Filed: Aug. 4, 1997

Related U.S. Application Data

[63] Continuation-in-part of application No. 08/779,349, Jan. 6, 1997, abandoned.

[30] Foreign Application Priority Data

Aug. 7, 1996 [JP] Japan ................................. 8-208374

[51] Int. Cl.$^6$ ........................................................ H01F 5/08
[52] U.S. Cl. ........................ 335/216; 324/319; 335/299; 600/421; 600/422
[58] Field of Search ........................... 335/216, 296–301; 324/318, 319, 320; 600/410, 421, 422

[56] References Cited

U.S. PATENT DOCUMENTS

| | | | |
|---|---|---|---|
| 4,766,378 | 8/1988 | Danby et al. ........................... | 324/307 |
| 4,829,252 | 5/1989 | Kaufman ................................. | 324/309 |
| 5,153,546 | 10/1992 | Laskaris ................................. | 335/216 |
| 5,361,054 | 11/1994 | Knuttel ................................... | 335/216 |
| 5,386,191 | 1/1995 | McCarten et al. ..................... | 324/318 |
| 5,610,521 | 3/1997 | Zou et al. .............................. | 324/318 |

*Primary Examiner*—Lincoln Donovan
*Assistant Examiner*—Raymond Barrera
*Attorney, Agent, or Firm*—Sughrue, Mion, Zinn, Macpeak & Seas, PLLC

[57] ABSTRACT

Annular portions are arranged on mutually confronting surfaces at circumferential edge portions of low-temperature containers, the annular portions forming annular containing portions whose cross section is rectangular. Not only a side coil among a group of coils forming a collective coil body is disposed inside the containing portion, but also a gradient magnetic field unit, a radio-frequency transmission coil, and a reception coil are disposed inside a recessed portion so as to be integrated with one another into a single body, the recessed portion being formed so as to be surrounded by the corresponding annular portion. The side coil supplies more than half a designed magnetomotive force. Since a distance J of the mutually confronting low-temperature containers, i.e., the distance between the mutually confronting surfaces of the side coils can be reduced by a distance corresponding to the projection of the projected portions, not only the designed magnetomotive force can be reduced, but also the apparatus can be downsized and inexpensive.

7 Claims, 7 Drawing Sheets

SPLIT TYPE MAGNETIC FIELD GENERATING APPARATUS FOR MRI

This is a Continuation-in-Part of Application Ser. No. 08/779,349 filed Jan. 6, 1997 is now abandoned.

BACKGROUND OF THE INVENTION

The invention relates to a magnetic field generating apparatus applied to nuclear magnetic resonance imaging apparatus (hereinafter referred to as "MRI").

FIG. 5 is a diagram showing the appearance of a split type magnetic field generating apparatus for MRI (hereinafter referred to simply as the "magnetic field generating apparatus" whenever applicable) disclosed in U.S. Pat. No. 5,436,607. In FIG. 2, reference numeral 100 denotes a magnetic pole unit, which is composed of a superconducting coil 101 and a magnetic pole piece 102 made of a ferromagnetic substance. Two magnetic pole units 100 are arranged in pair so as to confront each other with the axis thereof extending in a vertical direction as shown in FIG. 5. A uniform magnetic field is generated within an imaging aperture 103 that is formed in between the pair of magnetic pole units. It is in this imaging aperture 103 that a subject (patient) is placed.

In MRI, a gradient magnetic field generating unit for obtaining positional information and RF coils (radio-frequency transmission and reception coils) are disposed between the pair of magnetic pole units, so that information about a distribution of predetermined nuclei on a desired slice of the subject can be obtained to thereby produce a tomographic image. The distance between the pair of magnetic pole units is determined by the respective sizes of a required central aperture in which the subject is placed, the RF coils, and the gradient magnetic field generating unit (an exemplary gradient magnetic field unit is disclosed in Unexamined Japanese Patent Publication No. Hei. 6-14900).

FIG. 6 is a sectional view showing a main portion of another conventional magnetic field generating apparatus. This apparatus employs no magnetic poles made of a ferromagnetic substance in order to reduce the weight of the apparatus. In FIG. 6, reference numeral 110 denotes a magnetic pole unit, which is constructed as follows. Reference numeral 111 denotes a low-temperature container which is circularly annular about an axis Z and is rectangular in cross section; 112, a collective coil body that has a side coil 112$a$ and second to fifth coils 112$b$ to 112$e$. The side coil is rectangular in cross section and is circularly annular about the axis Z. Reference numeral 114 denotes a disclike gradient magnetic field generating unit; 115, a flat radio-frequency transmission coil (hereinafter referred to simply as "the transmission coil" whenever applicable); and 116, a flat radio-frequency reception coil (hereinafter referred to simply as "the reception coil" whenever applicable).

The thus constructed magnetic pole units 110 are arranged so as to confront each other in the Z axis direction in pair. The two magnetic pole units 110 are arranged in such a manner that a distance J is interposed between the mutually confronting reception coils 116 thereof to thereby ensure a central aperture for placing a subject. The distance between the mutually confronting side coils 112$a$ under this condition is represented by H in FIG. 6. A uniform magnetic field is generated within an imaging aperture formed between the pair of magnetic pole units, and it is in this imaging aperture that the subject (patient) is placed.

In order to give a sense of openness to the subject, it is desired that the central aperture for placing the subject be large, which in turn requires a large distance between the pair of magnetic pole units. In addition, in order to improve the tomographic resolution, a large magnetic field output is required. It is for this reason that the size of the magnetic pole unit 10 tends to increase.

When the distance between the pair of magnetic pole units is increased, a magnetomotive force required by the magnetic pole 10 is also increased. FIG. 7 is a graph showing a relationship between the inter-coil distance H (H/2) and magnetomotive force in a magnetic field generating apparatus whose central magnetic field is 0.5 tesla. In FIG. 7, reference character H denotes the inter-coil distance including the imaging aperture. The abscissa is graduated with H/2 as a reference. It may be noted that FIG. 7 indicates both a nonshield type (denoted as N/S) and an active shield type (denoted as A/S). The nonshield type has no shield coils, so that the magnetic field of the magnetic field generating apparatus leaks outside. The active shield type has shield coils that control leakage of the magnetic field to the outside.

It is understood from FIG. 7 that a required magnetomotive force is proportional to substantially the 5th power of the inter-coil distance, whether the magnetic field generating apparatus be of the nonshield type or of the active shield type.

As described above, when the distance between the mutually confronting magnetic pole units, i.e., the distance between the mutually confronting collective coil bodies is increased in the conventional split type magnetic field generating apparatuses, a required magnetomotive force is increased to a significant degree, which in turn has imposed the problem of increasing the structure of the coils and hence the price and weight of the apparatus.

SUMMARY OF THE INVENTION

The object of the invention is to implement a small-sized, inexpensive split type magnetic field generating apparatus for MRI which requires a small magnetomotive force.

In order to achieve the above object, the invention is applied to a split type magnetic field generating apparatus for MRI, in which a recessed space for accommodating a gradient magnetic field generating coil is provided at a confronting face of a coil accommodating container which is arranged to confront each other in an axial direction of said plurality of coils with a predetermined spacial distance.

According to this structure, the gradient magnetic field generating coil is accommodated in the recessed space, so that the distance between the mutually confronting coil accommodating containers can be reduced. Therefore, a magnetomotive force required for generating a predetermined magnetic field is reduced.

Further, according to the present invention, a predetermined coil among the plurality of annular coils is disposed in a annular portion which surrounds the recessed space, and the predetermined coil is arranged to surround said gradient magnetic field generating coil.

Further, according to the present invention, the gradient magnetic field generating coil is accommodated in the recessed space.

Further, according to the present invention, at least one of a radio-frequency transmission coil and a radio-frequency reception coil is accommodated in the recessed space.

Further, according to the present invention, while the gradient magnetic field generating coil is accommodated in the recessed space, a radio-frequency transmission coil and a radio-frequency reception coil are disposed outside the recessed space.

Since the radio-frequency transmission coil and the radio-frequency reception coil are disposed outside the recessed portion, the radio-frequency transmission coil and the radio-frequency reception coil can be visibly observed from outside the recessed portion and handled outside the recessed portion with ease. Therefore, the operation of adjusting the position and posture of the radio-frequency transmission coil and the radio-frequency reception coil can be facilitated.

DETAILED DESCRIPTION OF THE PREFERRED EMBODIMENT

First Embodiment

Figure 1:
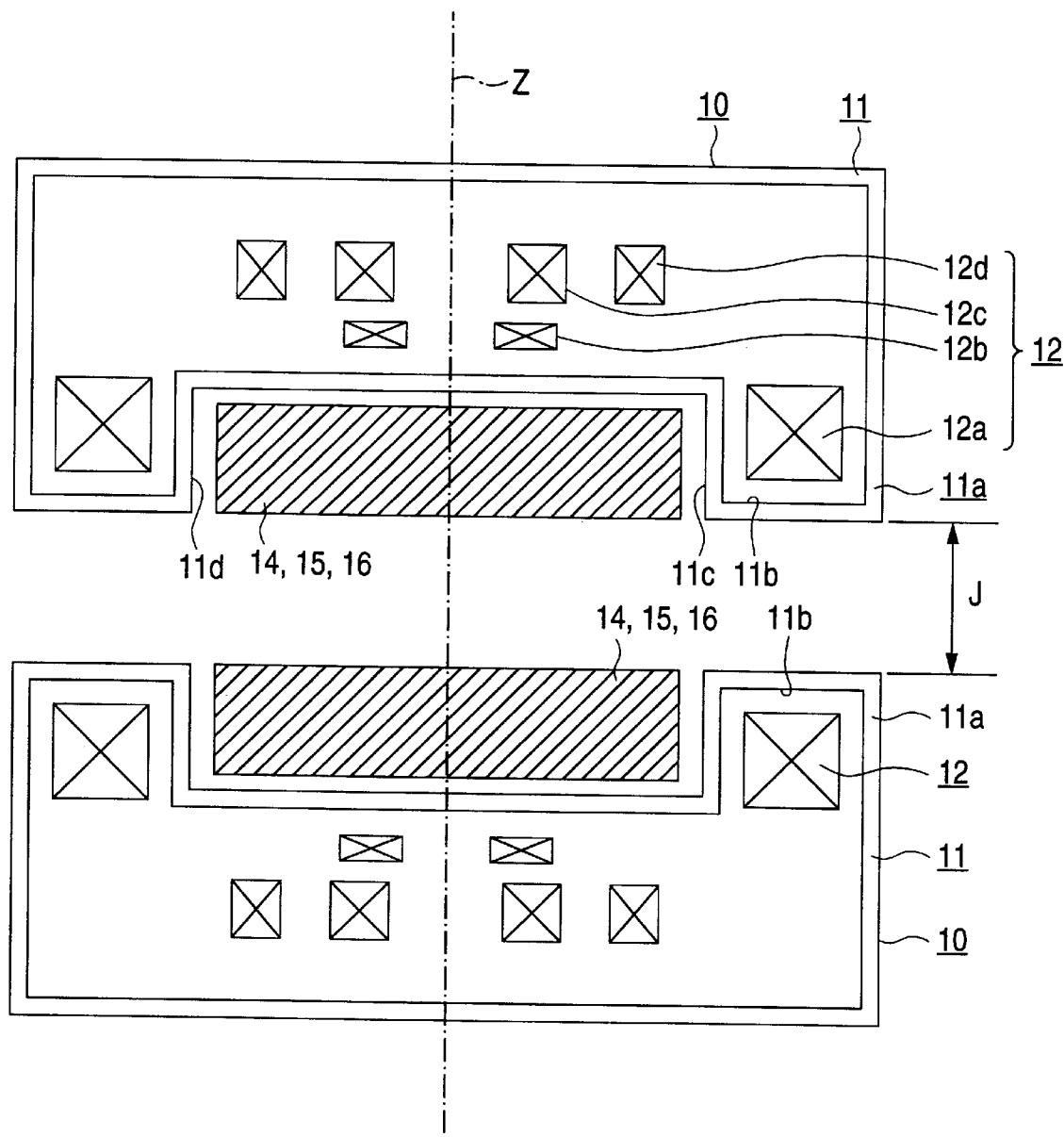
FIG. 1 is a sectional view showing a main portion of a magnetic field generating apparatus according to a first embodiment of the invention.

FIG. 1 is a sectional view showing a main portion of a magnetic field generating apparatus according to a first embodiment of the invention. In FIG. 1, reference numeral 10 denotes a magnetic pole unit, which is constructed as follows. Reference numeral 11 denotes a cylindrical low-temperature container. Although the detailed construction is not shown in the drawing, the low-temperature container 11 includes a vacuum vessel, two heat radiation shields against temperatures [80K] and [20K], and a liquid helium vessel, and contains a collective superconducting coil body 12. The low-temperature container 11 has a projected portion 11a that is circularly annular about an axis Z and is rectangular in cross section. The projected portion 11a is formed so as to project at a predetermined height toward a central aperture for placing a subject. More specifically, the projected portions 11a are formed so as to project from both circumferential edge portions of the mutually confronting surfaces of the low-temperature containers 11. The circularly annular projected portion 11a provides therein a circularly annular containing portion 11b that is rectangular in cross section. Further, a recessed portion 11d is formed so as to be surrounded by a side wall 11c on the inner circumferential side (toward the axis Z) of each projected portion 11a. The vacuum vessel and liquid helium vessel of the low-temperature container 11 are made by welding nonmagnetic stainless steel sheets.

Reference numeral 12 denotes the collective coil body. The collective coil body has a side coil 12a, a second coil 12b, a third coil 12c, a fourth coil 12d, the side coil being circularly annular about the axis Z and rectangular in cross section. The collective coil bodies 12 are accommodated in the low-temperature containers 11 and are kept cooled to a temperature indicating superconductivity. While each of the coils 12a to 12d is wound around a circularly annular winding frame that is square C-shaped in cross section, the winding frame itself is not shown in the drawing. Reference numeral 14 denotes a gradient magnetic field generating unit composed of a coil; 15, a transmission coil; and 16, a reception coil. In this embodiment, the gradient magnetic field generating unit 14, the transmission coil 15, and the reception coil 16 are integrated into a single body with a synthetic resin and the entire structure of such body is disclike. The gradient magnetic field generating unit 14, the transmission coil 15, and the reception coil 16 that are integrated into a single body are accommodated in each recessed portion 11d formed by the corresponding circularly annular projected portion 11a so as not to project from the projected portion 11a.

The magnetic pole unit 10 is constructed as described above, and a pair of magnetic pole units 10 of the same size are disposed so as to confront each other while interposing a distance J therebetween in the Z axis direction as shown in FIG. 1. A split type magnetic generating apparatus is thus formed. It may be noted that this magnetic field generating apparatus employs no magnetic poles in order to reduce the weight of the apparatus.

Thus, the projected portion 11a is caused to project at the predetermined height so that the entire part of the thus integrated body of the gradient magnetic field generating unit 14, the transmission coil 15, and the reception coil 16 can be accommodated inside the corresponding recessed portion 11d. Therefore, the distance between the mutually confronting surfaces of the magnetic pole units 10 can be decreased correspondingly thereto. Especially, the distance between the mutually confronting surfaces of the side coils 12a can be short. Therefore, a designed magnetomotive force of the collective coil bodies 12 can be reduced, which in turn contributes to downsizing the collective coil bodies 12 and hence to downsizing the magnetic field generating apparatus. Of course, the gradient magnetic field generating unit 14, the transmission coil 15, and the reception coil 16 that are integrated into a single body may be accommodated in the recessed portion 11d in such a manner that the entire part of the integrated single body is not completely concealed inside the recessed portion 11d but that part thereof comes out of the recessed portion 11d.

Figure 7:
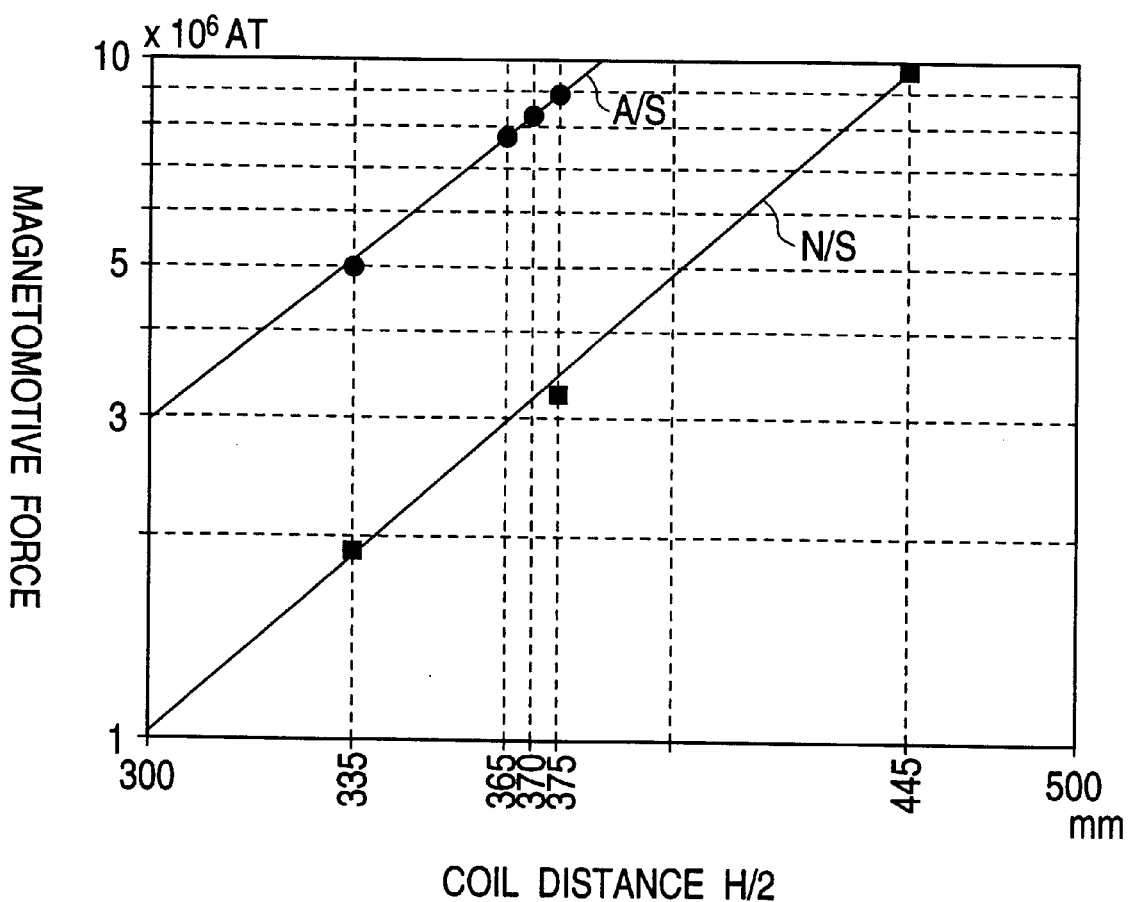
FIG. 7 is a graph showing a relationship between the inter-coil distance and magnetomotive force of the magnetic field generating apparatus shown in FIG. 6.

It may be noted that the side coil 12a supplies, e.g., about 70[%] of the designed magnetomotive force and that the second coil 12b to the fourth coil 12d supply the remainder of the designed magnetomotive force. While the total number of coils in the collective coil body and the relative positional relationship among the side coil 12a, the second coil 12b to the fourth coil 12d are different from those of the conventional example shown in FIG. 7, a magnetic field having required strength and uniformity can be generated by setting the position of the respective coils and allotting the magnetomotive force among the coils properly.

Second Embodiment

Figure 2:
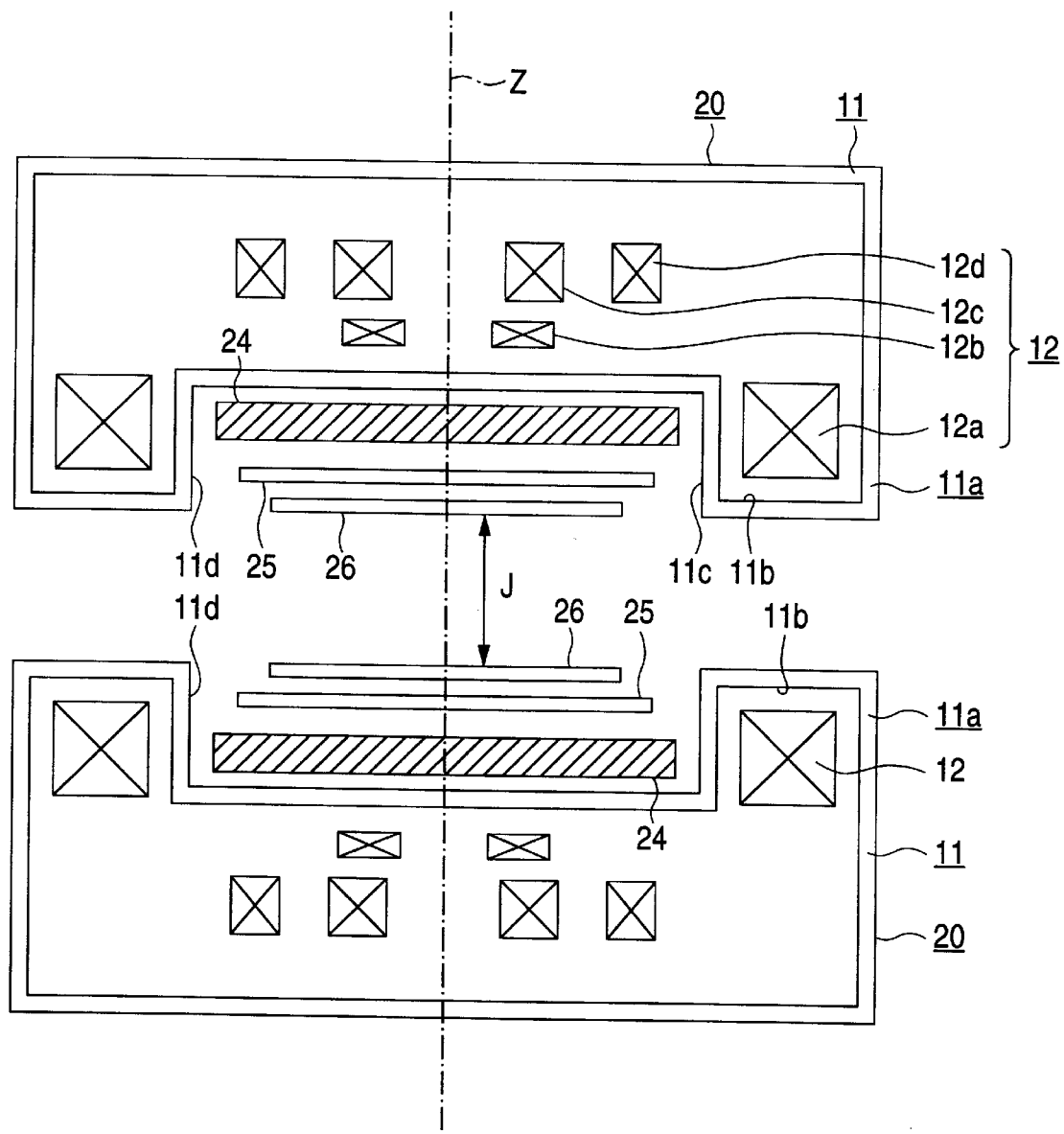
FIG. 2 is a sectional view showing a main portion of a magnetic field generating apparatus according to a second embodiment of the invention.

FIG. 2 is a sectional view showing a main portion of a magnetic field generating apparatus, which is another mode of embodiment of the invention. In this mode of embodiment, a gradient magnetic field generating unit 24 composed of a coil, a transmission coil 25, a reception coil 26, which are independent pieces, are accommodated in the recessed portion 11d formed by the projected portion 11a. The gradient magnetic field generating unit 24, the transmission coil 25, and the reception coil 26 are platelike with not shown coil conductors made of a copper sheet solidified with a synthetic resin. The gradient magnetic field generating unit 24 is circular; the transmission coil 25 is rectangular in slightly smaller structure than the gradient magnetic field generating unit 24; and the reception coil 26 is rectangular in slightly smaller structure than the transmission coil 25. The transmission coil 25 is fixed to the gradient magnetic field generating unit 24, and the reception coil 26 is firmly secured to the transmission coil 25.

It may be noted that the gradient magnetic field generating unit 24, the transmission coil 25, and the reception coil 26 are shown at a larger distance than the actual distance in the drawing. The magnetic pole units 20 are thus constructed with the reception coils 26 confronting each other while interposing a distance J therebetween.

Since other constructional aspects are the same as those shown in FIG. 1, the descriptions thereof will be omitted with corresponding parts being denoted as the same reference numerals.

As described above, by assembling the gradient magnetic field generating unit 24, the transmission coil 25, and the reception coil 26 into the corresponding recessed portion 11d independently, these members can be positioned and postured individually, which in turn facilitates the adjusting operation.

Third Embodiment

Figure 3:
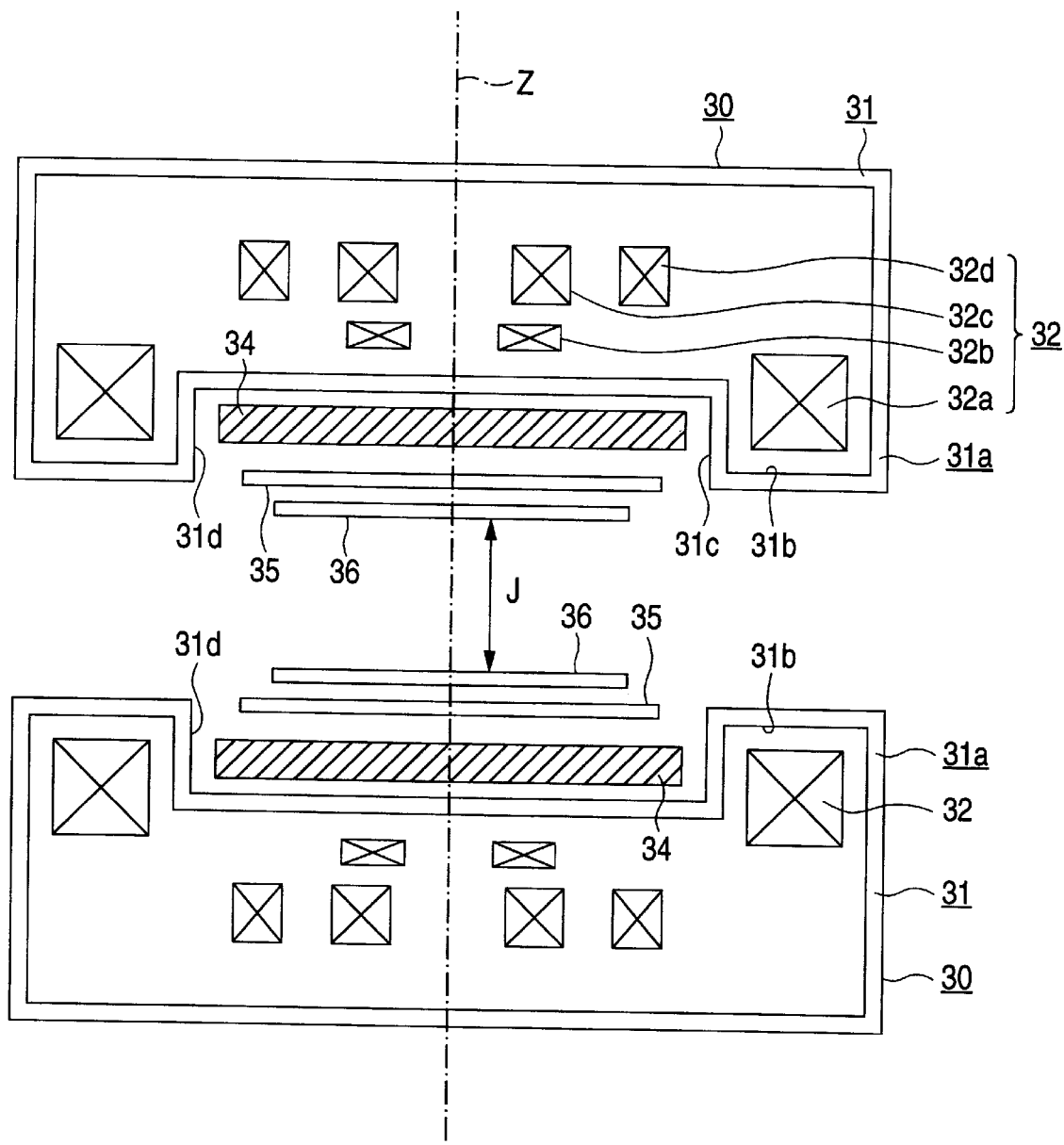
FIG. 3 is a sectional view showing a main portion of a magnetic field generating apparatus according to a third embodiment of the invention.

FIG. 3 is a sectional view showing a main portion of a magnetic field generating apparatus according to a third embodiment of the invention. In this mode of embodiment, a magnetic pole unit 30 is constructed as follows. A gradient magnetic field coil 34 and a transmission coil 35 are accommodated inside a recessed portion 31d formed by a side wall 31c of a projected portion 31a of a low-temperature container 31, and a reception coil 36 is disposed outside the recessed portion 31d. Part of a side coil 32a of a collective coil body 32 is contained in a containing portion 31b of the projected portion 31a. Such magnetic pole units 30 constitute a magnetic field generating apparatus with the reception coils 36 thereof disposed so as to confront each other in an axial direction while interposing a distance J therebetween. In this case, the distance between the mutually confronting collective coil bodies 32 is slightly larger than that of the mode of embodiment shown in FIG. 2. However, by setting the conditions of the coils 32a to 32d correspondingly thereto, a magnetic field having predetermined strength and uniformity can be generated at a predetermined place.

By disposing the reception coil 36 outside the corresponding recessed portion 31d, the position of the reception coil can be adjusted to a subject while observing the reception coil from outside. In addition, the reception coil can be handled outside the recessed portion 31d. Therefore, the adjusting operation can be facilitated.

Fourth Embodiment

Figure 4:
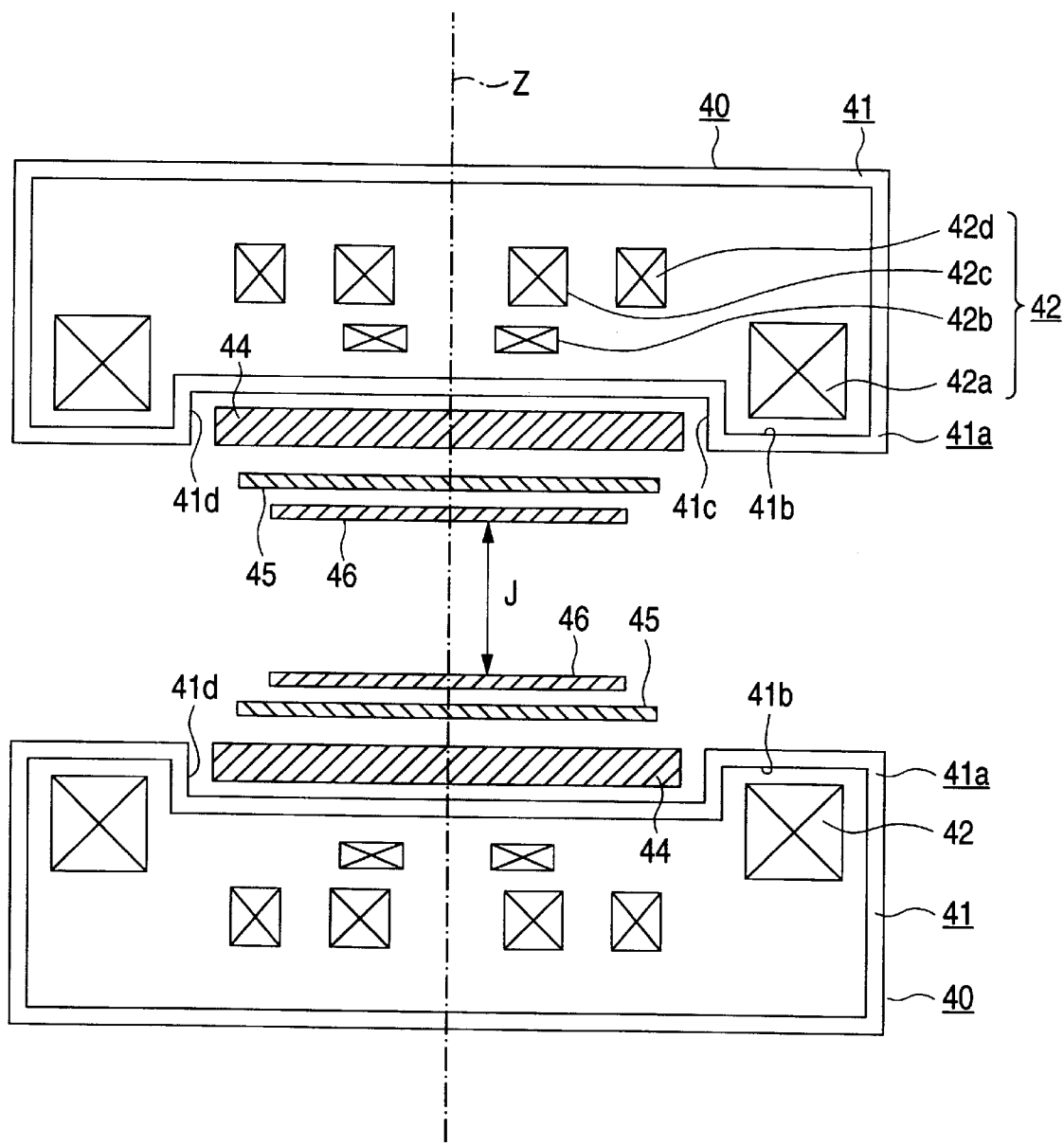
FIG. 4 is a sectional view showing a main portion of a magnetic field generating apparatus according to a fourth embodiment of the invention.
Figure 5:
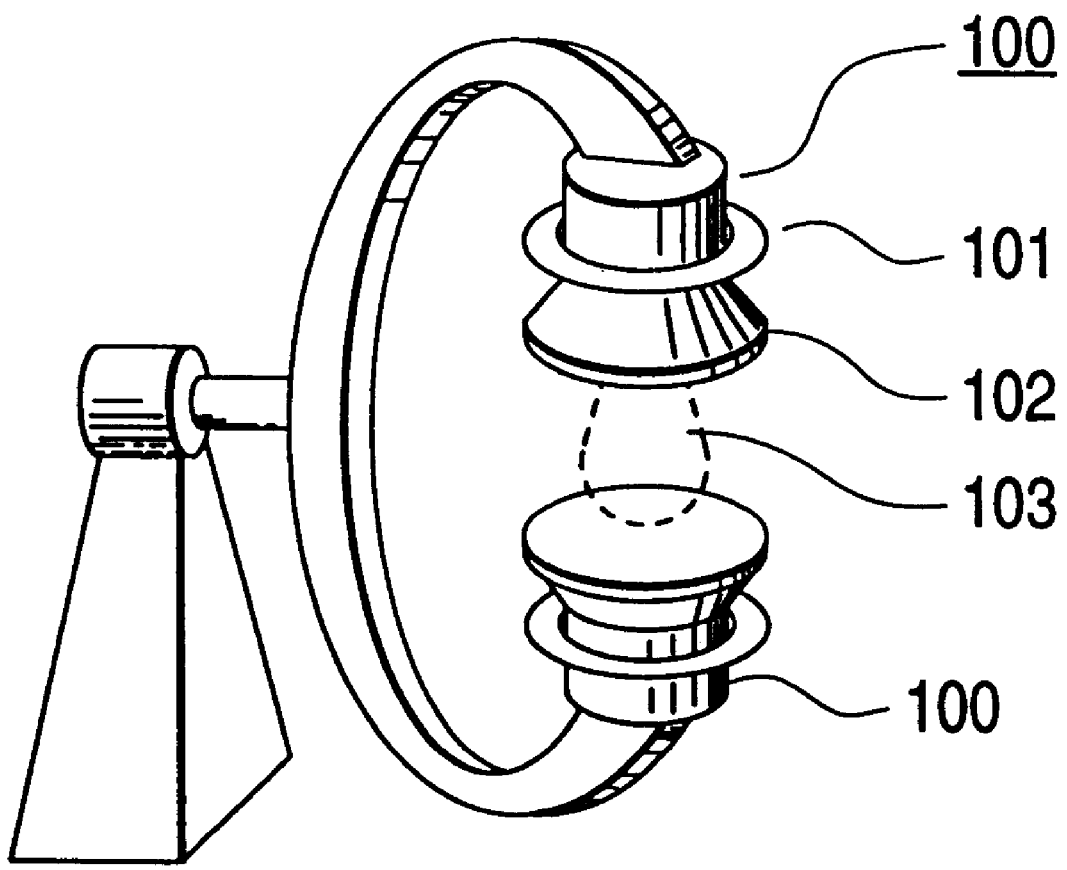
FIG. 5 is a diagram showing the appearance of a conventional magnetic field generating apparatus.
Figure 6:
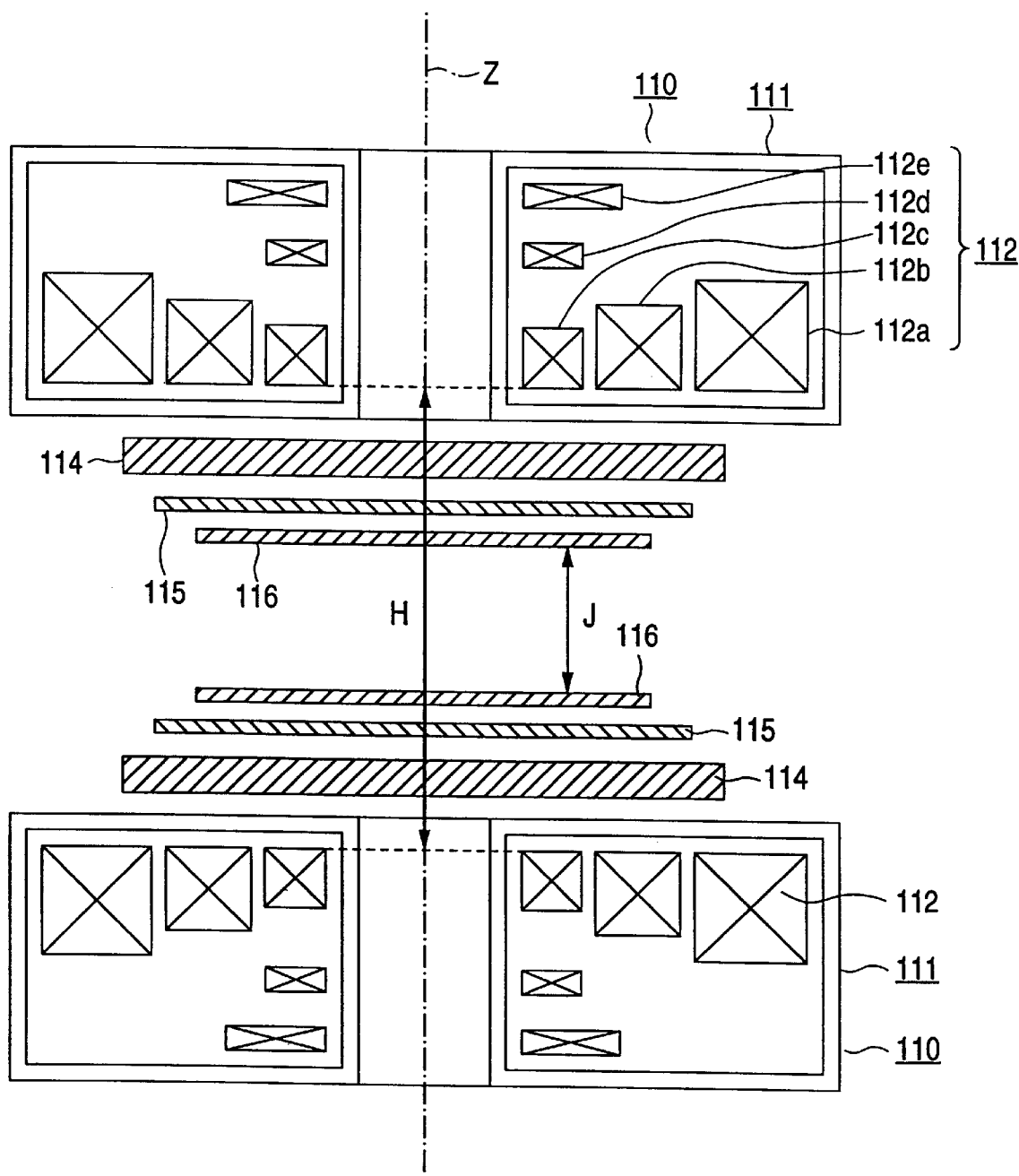
FIG. 6 is a sectional view showing a main portion of another conventional magnetic field generating apparatus.

FIG. 4 is a sectional view showing a main portion of a magnetic field generating apparatus according to a third embodiment of the invention. In this mode of embodiment, a magnetic pole unit 40 is constructed as follows. A gradient magnetic field coil 44 is accommodated inside a recessed portion 41d formed by a side wall 41c of a projected portion 41a of a low-temperature container 41, and a transmission coil 45 and a reception coil 46 are disposed outside the recessed portion 41d. Part of a side coil 42a of a collective coil body 42 is contained in a containing portion 41b of the projected portion 41a. Such magnetic pole units 40 constitute a magnetic field generating apparatus with the reception coils 46 thereof disposed so as to confront each other in an axial direction while interposing a distance J therebetween. In this case, the distance between the mutually confronting collective coil bodies 42 is slightly larger than that of the mode of embodiment shown in FIG. 2. However, by setting the conditions of the coils 42a to 42d correspondingly thereto, a magnetic field having predetermined strength and uniformity can be generated at a predetermined place.

By disposing the transmission coil 45 and the reception coil 46 outside the corresponding recessed portion 41d, the position of the transmission coil and reception coil can be adjusted to a subject while observing the transmission coil and the reception coil from outside. In addition, the transmission coil and the reception coil can be handled outside the recessed portion 41d. Therefore, the adjusting operation can be facilitated.

As described above, according to the respective modes of embodiment of the invention, the distance between the mutually confronting collective coil bodies 12, 32, 42, particularly, the outermost mutually confronting side coils 12a, 32a, 42a can be reduced. Therefore, a designed magnetomotive force of the collective coil bodies can be reduced. According to the graph shown in FIG. 7, if the inter-coil distance H in an active shield type A/S magnetic field generating apparatus is reduced by 80 [mm] from 375×2 =750 [mm] to 335×2=670 [mm], i.e., by about 10.7%, a designed magnetomotive force becomes about (5/9)×100= 56 [%]. Therefore, the collective coil bodies can be downsized correspondingly thereto. Hence, the size and weight of the magnetic field generating apparatus can be reduced.

Of course, a plurality of coils including coils other than the side coil may be contained in the annular projected portion. Further, a plurality of annular projected portions may be arranged concentrically, and a side coil and other coils may be contained in the annular projected portions, respectively. Still further, the low-temperature container may be circularly annular.

Still further, the annular coils are not limited to circularly annular ones, but may be rectangularly annular or ovally annular ones, i.e., looplike ones. Still further, the shape of the low-temperature container may be modified so as to correspond to the shape of the coils as long as such modification does not impair the object of the invention.

Still further, the order for arranging the gradient magnetic field generating unit, the transmission coil, and the reception coil is not limited to the aforementioned embodiment. A single coil may be employed if such single coil can perform the function of the transmission coil and that of the reception coil properly, e.g., on a time-sharing basis. Similar advantages can be provided even if the transmission coil and the reception coil do not have a rectangular-platelike shape but have other shapes.

While the magnetic field generating apparatuses in which the central axis Z of the collective coil bodies runs in a vertical direction have been described, the invention may also be applied to a magnetic field generating apparatus in which the central axis Z extends in a horizontal or gradient direction.

While the magnetic field generating apparatuses in which the collective coil bodies are constructed of superconducting coils have been described in the aforementioned modes of embodiment, it goes without saying that the invention may be applied to a magnetic field generating apparatus employing normal conducting coils without any low-temperature container. Of course, similar advantages can be obtained, whether the invention be applied to a nonshield type or to an active shield type.

Since the invention is constructed as described in the foregoing, the following advantages can be obtained.

According to the present invention, a recessed space for accommodating a gradient magnetic field generating coil is provided at a confronting face of a coil accommodating container which is arranged to confront each other in an axial direction of the plurality of coils with a predetermined spacial distance. The gradient magnetic field generating coil can be accommodated in the recessed space, so that the distance between the mutually confronting coil accommodating containers can be reduced. As a result, a designed magnetomotive force is reduced, which in turn contributes to downsizing the collective coil bodies and hence to reducing the size and weight of the magnetic field generating apparatus.

Further, according to the present invention, a predetermined coil among the plurality of annular coils is disposed in a annular portion which surrounds the recessed space, and the predetermined coil is arranged to surround said gradient magnetic field generating coil. Therefore, the distance between the respective coil accommodating containers can be reduced, which in turn allows a designed magnetomotive force to be reduced. As a result, the collective coil bodies can be downsized, and hence the size and weight of the magnetic field generating apparatus can be reduced.

Further, the gradient magnetic field generating coil is accommodated in the recessed space. Therefore, the distance between the respective coil accommodating containers can be reduced, which in turn allows a designed magnetomotive force to be reduced. As a result, the collective coil bodies can be downsized, and hence the size and weight of the magnetic field generating apparatus can be reduced.

Furthermore, at least one of a radio-frequency transmission coil and a radio-frequency reception coil is accommodated in the recessed space. Therefore, the distance between the respective coil accommodating containers can be reduced, which in turn allows a designed magnetomotive force to be reduced. As a result, the collective coil bodies can be downsized, and hence the size and weight of the magnetic field generating apparatus can be reduced.

Further, while the gradient magnetic field generating coil is accommodated in the recessed space, a radio-frequency transmission coil and a radio-frequency reception coil are disposed outside the recessed space. Since the radio-frequency transmission coil and the radio-frequency reception coil are disposed outside the recessed portion, the size and weight of the magnetic field generating apparatus can be reduced. And, the radio-frequency transmission coil and the radio-frequency reception coil can be visibly observed from outside the recessed portion and handled outside the recessed portion with ease. Therefore, the operation of adjusting the position and posture of the radio-frequency transmission coil and the radio-frequency reception coil can be facilitated.

What is claimed is:

1. A split type magnetic field generating apparatus for a magnetic resonance imaging apparatus, comprising:

a pair of magnetic pole units disposed to confront each other through a space in which a static magnetic field is generated;

each of the pair of magnetic pole units including:

a container for sealingly enclosing a refrigerant; and a plurality of coils for generating the static magnetic field, which are accommodated in said container;

wherein a coil having a maximum diameter of said coils is positioned closest to the space in which the static magnetic field is generated, and said container has a recess portion having at least a gradient magnetic field generating coil disposed therein, said recess portion facing the space of the static magnetic field and formed inside of an inner diameter of said coil having the maximum diameter.

2. A split type magnetic field generating apparatus as claimed in claim 1, wherein said pair of magnetic pole units are arranged in a vertical direction.

3. A split type magnetic field generating apparatus for a magnetic resonance imaging apparatus, comprising:

a pair of magnetic pole units disposed to confront each other through a space in which a static magnetic field is located;

each magnetic pole unit including:

a container for sealingly enclosing a refrigerant;

a plurality of coils for generating the magnetic field, which are accommodated in said container; and a planar coil for generating a gradient magnetic field;

wherein a coil having a maximum diameter of said coils is positioned closest to the space in which the static magnetic field is located; and said container has a recess portion having at least a gradient magnetic field generating coil disposed therein, said recess portion facing the space in which the static magnetic field is located and formed inside of an inner diameter of said coil having a maximum diameter; and said planar coil for generating the gradient magnetic field is accommodated in the recess portion of the container of the magnetic pole unit.

4. A split type magnetic field generating apparatus as claimed in claim 3, further comprising a radio-frequency transmission coil and a radio-frequency reception coil, which are disposed outside the recess portion in which the planar gradient magnetic field generating coil is accommodated.

5. A split type magnetic field generating apparatus as claimed in claim 3, further comprising a radio-frequency transmission coil and a radio-frequency reception coil, wherein at least one of the radio-frequency transmission coil and the radio-frequency reception coil is disposed in the recess portion in which the planar gradient magnetic field generating coil is accommodated.

6. A split type magnetic field generating apparatus as claimed in claim 3, further comprising a radio-frequency transmission coil and a radio-frequency reception coil, which are disposed in the recess portion in which the planar gradient magnetic field generating coil is accommodated.

7. A split type magnetic field generating apparatus as claimed in claim 3, further comprising a radio-frequency transmission coil and a radio-frequency reception coil, which are integrally formed with said planar coil for generating a gradient magnetic field.

\* \* \* \* \*